(12) United States Patent
Saitoh et al.

(10) Patent No.: US 8,399,888 B2
(45) Date of Patent: Mar. 19, 2013

(54) P-TYPE SIC SEMICONDUCTOR

(75) Inventors: Hiroaki Saitoh, Mishima (JP); Akinori Seki, Shizuoka-ken (JP); Tsunenobu Kimoto, Kyoto (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 23 days.

(21) Appl. No.: 13/127,814

(22) PCT Filed: Nov. 19, 2009

(86) PCT No.: PCT/IB2009/007497
§ 371 (c)(1),
(2), (4) Date: May 5, 2011

(87) PCT Pub. No.: WO2010/058264
PCT Pub. Date: May 27, 2010

(65) Prior Publication Data
US 2011/0210341 A1    Sep. 1, 2011

(30) Foreign Application Priority Data

Nov. 20, 2008  (JP) .................................. 2008-296814

(51) Int. Cl.
*H01L 29/15* (2006.01)
(52) U.S. Cl. .............. 257/77; 257/51; 257/76; 257/102; 257/134; 257/155
(58) Field of Classification Search ........................ None
See application file for complete search history.

(56) References Cited

U.S. PATENT DOCUMENTS 5,063,421 A * 11/1991 Suzuki et al. .................. 257/77
5,281,831 A    1/1994 Uemoto et al.
6,599,644 B1 * 7/2003 Zekentes et al. .............. 428/627

FOREIGN PATENT DOCUMENTS

| JP | 4-206578 | 7/1992 |
|----|----------|--------|
| JP | 10-70273 | 3/1998 |
| JP | 2005-507360 | 3/2005 |

(Continued)

OTHER PUBLICATIONS

International Search Report in International Application No. PCT/IB2009/007497; Mailing Date: Feb. 15, 2010.
T. L. Straubinger et al., "Aluminum Doping of 6H- and 4H-SiC with a Modified PVT Growth Method," Materials Science Forum vols. 389-393, pp. 131-134 (2002).
T. L. Straubinger et al., "Aluminum Doping of 6H- and 4H-SiC with a Modified PVT Growth Method," Materials Science Forum vols. 389-393, pp. 131-134 (2002).
Written Opinion of the International Searching Authority in International Application No. PCT/IB2009/007497; Mailing Date: Feb. 15, 2010.

(Continued)

*Primary Examiner* — Kyoung Lee
(74) *Attorney, Agent, or Firm* — Finnegan, Henderson, Farabow, Garrett & Dunner, LLP

(57) ABSTRACT

A p-type SiC semiconductor includes a SiC crystal that contains Al and Ti as impurities, wherein the atom number concentration of Ti is equal to or less than the atom number concentration of Al. It is preferable that the concentration of Al and the concentration of Ti satisfy the following relations: (Concentration of Al)$\geq 5 \times 10^{18}$/cm$^3$; and 0.01%$\leq$(Concentration of Ti)/(Concentration of Al)$\leq$20%. It is more preferable that the concentration of Al and the concentration of Ti satisfy the following relations: (Concentration of Al)$\geq 5 \times 10^{18}$/cm$^3$; and $1 \times 10^{17}$/cm$^3\leq$(Concentration of Ti)$\leq 1 \times 10^{18}$/cm$^3$.

4 Claims, 1 Drawing Sheet

FOREIGN PATENT DOCUMENTS

| | | |
|---|---|---|
| JP | 2006-237319 | 9/2006 |
| JP | 2007-13154 | 1/2007 |
| JP | 2007-76986 | 3/2007 |
| JP | 2008-505833 | 2/2008 |
| JP | 2008-100890 | 5/2008 |
| JP | 2009-179491 | 8/2009 |
| WO | WO 2004/090969 A1 | 10/2004 |

OTHER PUBLICATIONS

Applicant's Response to the Written Opinion of the International Searching Authority in International Application No. PCT/IB2009/007497; Sep. 20, 2010.

International Preliminary Report on Patentability in International Application No. PCT/IB2009/007497; Completion Date: Nov. 22, 2010.

* cited by examiner

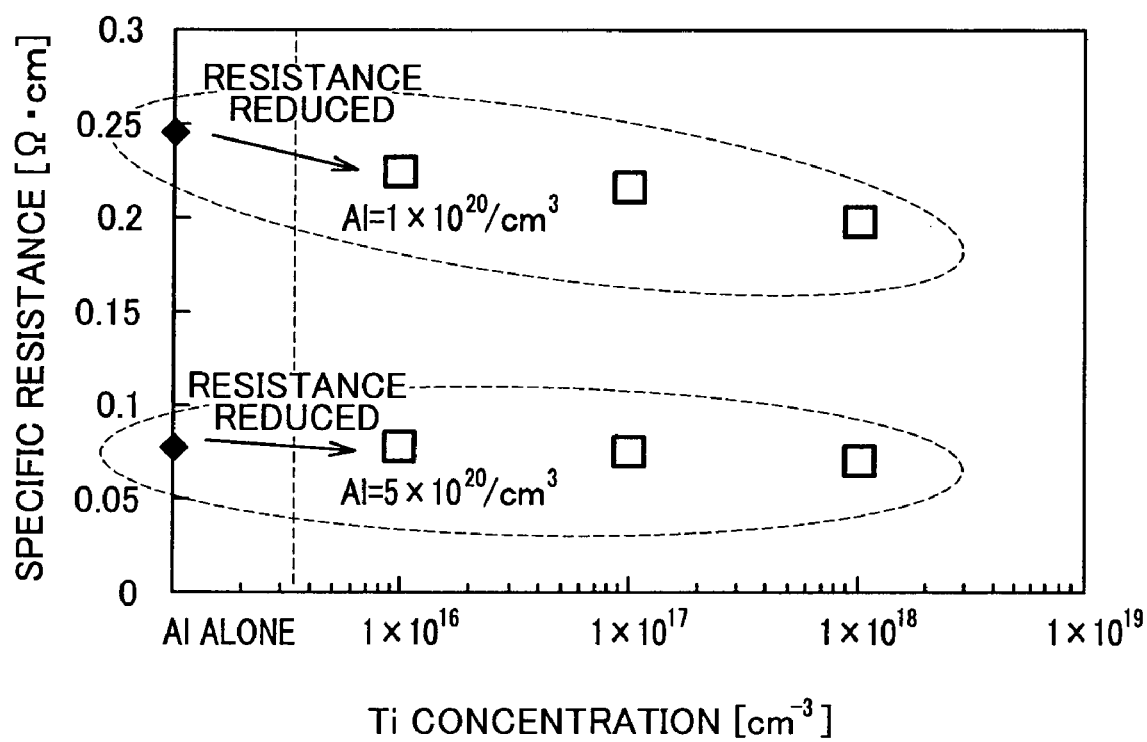

P-TYPE SIC SEMICONDUCTOR

BACKGROUND OF THE INVENTION

1. Field of the Invention

The invention relates to a SiC semiconductor, and in particular to a p-type SiC semiconductor of low resistance.

2. Description of the Related Art

It has been difficult to obtain a p-type SiC semiconductor of low resistance. For example, Published Japanese Translation of PCT application No. 2005-507360 (JP-A-2005-507360) describes the method of obtaining a semi-insulating SiC single crystal of high resistance by employing the combination of deep-energy-level intrinsic defects of high concentration and deep-energy-level acceptors (Ti and B). A method of manufacturing a p-type SiC single crystal by Al-doping, modified Lely method (sublimation method) is described in T. L. Staubinger, et al. Mat. Sci. Forum 389-393 (2002) p. 131. However, the crystal growth with high-concentration Al doping can adversely affect the crystallinity. Japanese Patent Application Publication No. 2008-100890 (JP-A-2008-100890) describes a manufacturing method that is characterized in that the liquid alloy used when a SiC single crystal is grown by liquid-phase growth method, is a Si—Al—M alloy (M is Ti, for example). However, Al and Ti are used to obtain a high-quality SiC single crystal and neither a method of controlling the amounts of these elements that are mixed into the crystal made nor the properties of the crystal are described in this document.

Reasons why it is difficult to manufacture a p-type SiC semiconductor are as follows.

Because in a SiC crystal, holes, which are p-type carriers, are lower in mobility as compared to electrons, which are n-type carriers, it is more difficult to obtain a low-resistance p-type SiC substrate than to obtain a low-resistance n-type SiC substrate.

Al and B are representative acceptors for p-type SiC. However, the ionization energy of Al and B is higher than that of N, which is a donor for n-type SiC. Thus, it is difficult to obtain a low-resistance p-type SiC substrate.

It is possible to use a method of increasing the amount of Al doping in order to reduce resistance. This, however, leads to a reduction in the mobility and the crystallinity of the SiC single crystal can also be reduced.

Thus, a method of independently controlling the amount of Al introduced into the SiC single crystal and the amount of Ti introduced thereinto is needed.

Japanese Patent Application Publication No. 2007-13154 (JP-A-2007-13154), Published Japanese Translation of PCT application No. 2008-505833 (JP-A-2008-505833), WO2004/090969, Japanese Patent Application Publication No. 10-70273 (JP-A-10-70273), and Japanese Patent Application Publication No. 2006-237319 (JP-A-2006-237319) describe that Al and Ti atoms are introduced into a SiC single crystal. However, these documents give no consideration to how to reduce the resistance.

SUMMARY OF THE INVENTION

The invention provides a p-type SiC semiconductor of low resistance.

An aspect of the invention is a p-type SiC semiconductor including a SiC crystal that contains, as impurities, Al and Ti, wherein the atom number concentration of Ti is equal to or less than the atom number concentration of Al.

In the above aspect, the atom number concentration of Al and the atom number concentration of Ti may satisfy the following relations: (Concentration of Al)$\geqq 5\times 10^{18}$/cm$^3$; and 0.01%$\leqq$(Concentration of Ti)/(Concentration of Al)$\leqq$20%.

In the above aspect, the atom number concentration of Al and the atom number concentration of Ti may satisfy the following relations: $5\times 10^{18}$/cm$^3$$\leqq$(Concentration of Al)$\leqq$$1\times 10^{20}$/cm$^3$; and 0.01%$\leqq$(Concentration of Ti)/(Concentration of Al)$\leqq$20%.

In the above aspect, the atom number concentration of Al and the atom number concentration of Ti may satisfy the following relations: (Concentration of Al)$\geqq 5\times 10^{18}$/cm$^3$; and $1\times 10^{17}$/cm$^3$$\leqq$(Concentration of Ti)$\leqq 1\times 10^{18}$/cm$^3$.

In the above aspect, the atom number concentration of Al and the atom number concentration of Ti may satisfy the following relations: $5\times 10^{18}$/cm$^3$$\leqq$(Concentration of Al)$\leqq$$1\times 10^{20}$/cm$^3$; and $1\times 10^{17}$/cm$^3$$\leqq$(Concentration of Ti)$\leqq 1\times 10^{18}$/cm$^3$.

According to the invention, a SiC single crystal is caused to contain, as acceptors, Ti as well as Al and the atom number concentration of Ti is equal to or less than the atom number concentration of Al, so that it is possible to reduce the specific resistance as compared to the case where Al alone is added.

BRIEF DESCRIPTION OF THE DRAWING

The foregoing and further objects, features and advantages of the invention will become apparent from the following description of examples with reference to the accompanying drawing, wherein FIG. 1 is a graph showing the variation of specific resistance with the change in the concentration of Ti for each of the concentrations of Al in a SiC single crystal to which Al and Ti atoms are added according to the invention.

DETAILED DESCRIPTION OF EMBODIMENTS

In the invention, it is preferable that the atom number concentration of Al and the atom number concentration of Ti satisfy the following relations: (Concentration of Al)$\geqq 5\times 10^{18}$/cm$^3$; and 0.01%$\leqq$(Concentration of Ti)/(Concentration of Al)$\leqq$20%.

It is more preferable that the atom number concentration of Al and the atom number concentration of Ti satisfy the following relations: (Concentration of Al)$\geqq 5\times 10^{18}$/cm$^3$; and $1\times 10^{17}$/cm$^3$$\leqq$(Concentration of Ti)$\leqq 1\times 10^{18}$/cm$^3$.

There is no need to limit the method of introducing Al and Ti to a particular method. The vapor deposition (sublimation process, chemical vapor deposition (CVD), etc.), the epitaxial growth method, the liquid phase growth, the ion implantation method, etc. may be used, for example.

A sample is made that is obtained by introducing Al and Ti atoms into a SiC single crystal by ion co-implantation. For the purpose of comparison, a sample is also made that is obtained by introducing only Al into a SiC single crystal.

<Implantation Sample>

8-degree off n-type 4H—SiC(0001) substrate with an n-type epitaxial layer (doping amount: approximately $5\times 10^{15}$/cm$^3$)

<Ion Implantation Conditions>

Depth of Implantation: 200 nm

Inclination Angle: 0°

Implantation Angle: 0°

Implantation Substrate Temperature: 500° C.

<High-Temperature Annealing after Implantation>

Heating Temperature: 1750° C.

Heating Time 20 minutes

The atom number concentration of Al and the atom number concentration of Ti are measured by secondary ion mass spectrometry (SIMS) for each of the samples into which ions have been implanted. Then, by conducting a Hall-effect measurement by the van der Pauw method, the specific resistance of each sample is determined. The result is collectively shown in Table 1. In Table 1, the specific resistance improvement rates that are obtained using the following equation are also shown.

Improvement Rate (%)={1−(ρ2/ρ1)}×100

ρ1: Specific resistance (Ω·cm) of the sample when Al alone is introduced
ρ2: Specific resistance (Ω·cm) of the sample when Al and Ti are introduced

TABLE 1

| Concentration of Al (/cm³) | Concentration of Ti (/cm³) | Ti/Al concentration ratio (%) | Specific Resistance (Ω · cm) | Specific Resistance Improvement Rate (*) | Effect | Sample No. |
|---|---|---|---|---|---|---|
| $2 \times 10^{17}$ | Not implanted | 0 | 3.61 | — | — | Comparative Example 1 |
|  | $5 \times 10^{16}$ | 25 | 4.21 | −17% | Negative | Comparative Example 2 |
| $5 \times 10^{18}$ | Not implanted | 0 | 1.03 | — | — | Comparative Example 3 |
|  | $1 \times 10^{17}$ | 2 | 0.93 | +10% | Positive | Example 1 |
|  | $1 \times 10^{18}$ | 20 | 0.80 | +22% | Positive | Example 2 |
|  | $5 \times 10^{18}$ | 100 | 1.23 | −19% | Negative | Comparative Example 4 |
|  | $1 \times 10^{19}$ | 200 | 1.51 | −47% | Negative | Comparative Example 5 |
| $1 \times 10^{20}$ | Not implanted | 0 | 0.25 | — | — | Comparative Example 6 |
|  | $1 \times 10^{16}$ | 0.01 | 0.23 | +8% | Positive | Example 3 |
|  | $1 \times 10^{17}$ | 0.1 | 0.22 | +12% | Positive | Example 4 |
|  | $1 \times 10^{18}$ | 1 | 0.20 | +20% | Positive | Example 5 |
|  | $5 \times 10^{18}$ | 5 | 0.22 | +12% | Positive | Example 6 |
|  | $1 \times 10^{19}$ | 10 | 0.23 | +8% | Positive | Example 7 |
| $5 \times 10^{20}$ | Not implanted | 0 | 0.077 | — | — | Comparative Example 7 |
|  | $1 \times 10^{16}$ | 0.002 | 0.078 | −1% | Negative | Comparative Example 8 |
|  | $1 \times 10^{17}$ | 0.02 | 0.075 | +3% | Positive | Example 8 |
|  | $1 \times 10^{18}$ | 0.2 | 0.071 | +8% | Positive | Example 9 |

(*) +: Improved −: Deteriorated

In Table 2, the specific resistance improvement rates for respective concentrations of Al and Ti are shown. In Table 2, the shaded cells indicate that the concentrations of Al and Ti are within the range as follows: (concentration of Al)≧5× $10^{18}$/cm³; and 0.01%≦(concentration of Ti)/(concentration of Al)≦20%, and the cells surrounded by thick lines indicate that the concentrations of Al and Ti are within the range as follows: (concentration of Al)≧5×$10^{18}$/cm³; and 1×$10^{17}$/cm³≦(concentration of Ti)≦1×$10^{18}$/cm³.

TABLE 2

(Improvement Rate)

|  |  | Concentration of Ti (/cm³) | | | | | |
|---|---|---|---|---|---|---|---|
|  |  | $1 \times 10^{16}$ | $5 \times 10^{16}$ | $1 \times 10^{17}$ | $1 \times 10^{18}$ | $5 \times 10^{18}$ | $1 \times 10^{19}$ |
| Concentration of Al (/cm³) | $2 \times 10^{17}$ | - | −17% | - | - | - | - |
|  | $5 \times 10^{18}$ |  |  |  |  | −19% | −47% |
|  | $1 \times 10^{20}$ |  |  |  |  |  |  |
|  | $5 \times 10^{20}$ | −1% |  |  |  |  |  |

Table 3 shows the ratio (%) of the concentration of Ti to the concentration of Al and Table 4 shows the relations between the respective ratios and the sample numbers.

TABLE 3

(Combinations of concentrations of Al and Ti)

| | | Concentration of Ti (/cm$^3$) | | | | | | | |
|---|---|---|---|---|---|---|---|---|---|
| | | $5 \times 10^{14}$ | $1 \times 10^{16}$ | $5 \times 10^{16}$ | $1 \times 10^{17}$ | $1 \times 10^{18}$ | $5 \times 10^{18}$ | $1 \times 10^{19}$ | $2 \times 10^{19}$ | $1 \times 10^{20}$ |
| Concentration of Al (/cm$^3$) | $2 \times 10^{17}$ | | | 25 | | | | | | |
| | $5 \times 10^{18}$ | | | | | | 100 | 200 | | |
| | $1 \times 10^{20}$ | | | | | | | | | |
| | $5 \times 10^{20}$ | | 0.002 | | | | | | | |

Cells containing a number: There is a measurement result

TABLE 4

(Sample Numbers)

| | | Concentration of Ti (/cm$^3$) | | | | | | |
|---|---|---|---|---|---|---|---|---|
| | | Not implanted | $1 \times 10^{16}$ | $5 \times 10^{16}$ | $1 \times 10^{17}$ | $1 \times 10^{18}$ | $5 \times 10^{18}$ | $1 \times 10^{19}$ |
| Concentration of Al (/cm$^3$) | $2 \times 10^{17}$ | Comparative Example 1 | | Comparative Example 2 | | | | |
| | $5 \times 10^{18}$ | Comparative Example 3 | | | | | Comparative Example 4 | Comparative Example 5 |
| | $1 \times 10^{20}$ | Comparative Example 6 | | | | | | |
| | $5 \times 10^{20}$ | Comparative Example 7 | Comparative Example 8 | | | | | |

FIG. 1 shows the variation of specific resistance with the change in the concentration of Ti when the concentration of Al is $1 \times 10^{20}$/cm$^3$ and $5 \times 10^{20}$/cm$^3$. It is clearly seen that when the concentration of Al is $1 \times 10^{20}$/cm$^3$, the specific resistance monotonously decreases as the concentration of Ti increases. When the concentration of Al is $5 \times 10^{20}$/cm$^3$, because the concentration of Al is high and the absolute value of the specific resistance is therefore relatively low even when no Ti is added, the decrease in the specific resistance with the increase in the concentration of Ti is small. However, it is perceived that there is a tendency of gradual decrease as a whole.

According to the invention, by adding both Al and Ti, a p-type SiC semiconductor is provided that is reduced in resistance as compared to the case where Al alone is added.

While the invention has been described with reference to examples thereof, it is to be understood that the invention is not limited to the described examples. To the contrary, the invention is intended to cover various modifications and equivalent forms.

The invention claimed is:

1. A p-type SiC semiconductor comprising a SiC crystal that contains, as impurities, Al and Ti, wherein an atom number concentration of Ti is equal to or less than an atom number concentration of Al.

2. The p-type SiC semiconductor according to claim 1, wherein the concentration of Al and the concentration of Ti satisfy the following relations:

Concentration of Al $\geq 5 \times 10^{18}$/cm$^3$; and $0.01\% \leq$ (Concentration of Ti)/(Concentration of Al) $\leq 20\%$.

3. The p-type SiC semiconductor according to claim 2, wherein the concentration of Al and the concentration of Ti satisfy the following relations:

$5 \times 10^{18}$/cm$^3 \leq$ Concentration of Al $\leq 1 \times 10^{20}$/cm$^3$; and $0.01\% \leq$ (Concentration of Ti)/(Concentration of Al) $\leq 20\%$.

4. The p-type SiC semiconductor according to claim 1, wherein the concentration of Al and the concentration of Ti satisfy the following relations:

Concentration of Al $\geq 5 \times 10^{18}$/cm$^3$; and $1 \times 10^{17}$/cm$^3 \leq$ Concentration of Ti $\leq 1 \times 10^{18}$/cm$^3$.

* * * * *